United States Patent
Ryu et al.

(10) Patent No.: US 6,201,745 B1
(45) Date of Patent: Mar. 13, 2001

(54) SEMICONDUCTOR MEMORY DEVICE WITH REDUNDANT ROW SUBSTITUTION ARCHITECTURE AND A METHOD OF DRIVING A ROW THEREOF

(75) Inventors: Hoon Ryu; Won-Il Bae, both of Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/544,358

(22) Filed: Apr. 6, 2000

(30) Foreign Application Priority Data

Apr. 27, 1999 (KR) .................................. 99-15079

(51) Int. Cl.[7] .................................. G11C 29/00
(52) U.S. Cl. ...................... 365/200; 365/230.06
(58) Field of Search .............. 365/200, 230.06, 365/185.09

(56) References Cited

U.S. PATENT DOCUMENTS

| | | |
|---|---|---|
| 5,581,508 | 12/1996 | Sasaki et al. .......................... 365/200 |
| 5,761,135 | 6/1998 | Lee .................................. 365/189.11 |
| 5,798,974 | 8/1998 | Yamagata .............................. 365/200 |
| 5,859,802 * | 1/1999 | Lee et al. .............................. 365/200 |
| 5,862,086 * | 1/1999 | Makimura et al. ................... 365/200 |
| 6,058,053 * | 5/2000 | Tsuji et al. ........................... 365/200 |
| 6,122,206 * | 9/2000 | Fujita .................................. 365/200 |

* cited by examiner

*Primary Examiner*—Tan T. Nguyen
(74) *Attorney, Agent, or Firm*—Skjerven Morrill Macpherson LLP; David Millers

(57) ABSTRACT

A semiconductor memory device has a sub word line driver structure and includes a main word line decoder driver, an address programming circuit, and a redundant main word line decoder driver. When row address bit signals are input, the main word line decoder driver drives a main word line corresponding to the row address bit signals regardless of a row replacement with redundant rows. If the row address bit signals correspond to programmed defective row address bit signals, the address programming circuit generates a redundant row select signal, in response to which the activated main word line is deactivated and a redundant main word line is activated. According to the redundant row replacement scheme of the present invention, access time is reduced without an increase of a layout area.

11 Claims, 9 Drawing Sheets

6,201,745 B1

SEMICONDUCTOR MEMORY DEVICE WITH REDUNDANT ROW SUBSTITUTION ARCHITECTURE AND A METHOD OF DRIVING A ROW THEREOF

FIELD OF THE INVENTION

The present invention relates to semiconductor memory devices, and more particularly to a semiconductor memory device with a redundancy structure capable of realizing a high-speed access and a method for driving a row thereof.

BACKGROUND OF THE INVENTION

Conventionally, semiconductor memory devices such as dynamic random access memories (DRAMs) that have high levels of integration also have high defect rates. In particular, many defects occur in memory element regions (e.g., memory cell arrays). To repair semiconductor memory devices containing such defects, the semiconductor memory devices typically include redundant row or column structures in the memory arrays.

FIG. 1 shows a layout of a conventional semiconductor memory device, and for brevity and clarity does not illustrate any peripheral circuits. More specifically, FIG. 1 illustrates a conventional dynamic random access memory device (DRAM) 10 having a sub word line driver (SWD) structure (sometimes referred to as "a divided word line structure" or "a hierarchical structure"). U.S. Pat. No. 5,581,508, entitled "SEMICONDUCTOR MEMORY HAVING SUB-WORD LINE REPLACEMENT," and U.S. Pat. No. 5,761,135, entitled "SUB-WORD LINE DRIVERS FOR INTEGRATED CIRCUIT MEMORYDEVICES AND RELATED METHODS," which are hereby incorporated by reference, disclose known sub word line driver structures.

The DRAM device 10 includes a plurality of memory cell blocks 12 arranged in row and column directions. Each of the memory cell blocks has a plurality of sub word lines SWL extending in the row direction and a plurality of redundant sub word lines RSWL extending in the row direction. The DRAM device 10 further includes a plurality of sub word line drivers (SWD) 14, a plurality of sense amplifiers (S/A) 16, a plurality of redundant sub word line drivers (RSWD) 18, a plurality of main word line decoder drivers 22, and a plurality of redundant main word line decoder drivers 24. Although not illustrated in FIG. 1, the main word line decoder drivers 22 drive multiple main word lines, and the redundant word line decoder drivers 24 drive multiple redundant main word lines.

The DRAM device 10 further includes a plurality of sub row decoders 26 and a plurality of drivers 28. Most of the sub row decoders 26 are between one of the main word line decoder drivers 22 and one of the redundant main word line decoder drivers 24. Most of the drivers 28 are between one of the sub word line drivers 14 and one of the redundant sub word line drivers 18. As shown in FIG. 1, the memory cell blocks 12 are separated in the row direction by the sub word line drivers 14 and in the column direction by the sense amplifiers 16.

In the sub word line driver structure of FIG. 1, when a sub word line is defective, a row redundancy operation replaces a main word line and associated structures including the defective sub word line with a redundant main word line and associated redundant structures. Accordingly, the row redundancy operation deselects (or deactivates) a main word line decoder driver 22 that drives the main word line coupled to a set of sub word lines including the defective sub word line. The row redundancy operation selects (or activates) a redundant main word line decoder driver 24 that drives the redundant main word line that replaces the main word line.

FIG. 2 is a circuit diagram showing a main word line decoder driver according to a first redundancy scheme. As illustrated in FIG. 2, the main word line decoder driver 22 includes a fuse 59 for a redundancy operation. The fuse 59 is blown (or cut) during a row redundancy operation to deselect a corresponding main word line MWLi even when three decode signals DRA0, DRA1 and DRA2 are activated. This redundancy scheme has the drawback of increasing the layout area due to the fuse 59, which is in each main word line decoder driver 22.

FIG. 3 is a circuit diagram showing a main word line decoder driver according to a second redundancy scheme, and FIG. 4 is a timing diagram showing timing relationships among control signals in the main word line decoder driver of FIG. 3.

In FIGS. 3 and 4, a signal PR has a logic low level during a row precharge period (when $\overline{RAS}$ is high) and a logic high level during a row active period (when $\overline{RAS}$ is low). Decode signals DRAi (i=0, 1, 2), which are signals derived by decoding row address bit signals at a previous stage (for example, a row predecoder), designate or select a main word line MWLi. A signal PRREB controls whether a main word line or a redundant main word line is selected. The signal PRREB is at a logic low level to disable use of the main word line MWLi corresponding to the row address bit signals and selects a redundancy main word line (not shown in FIG. 3). When the signal PRREB is at a logic high level, the main word line MWLi is usable. U.S. Pat. No. 5,798,974, entitled "SEMICONDUCTOR MEMORY DEVICE REALIZING HIGH SPEED ACCESS AND LOW POWER CONSUMPTION WITH REDUNDANT CIRCUIT," which is hereby incorporated by reference, discloses the redundancy system of FIG. 3 and an address programming circuit generating the signal PRREB.

When the signal (referred to as "a row active signal") PR remains low (e.g., during a row precharge period), an output signal PDPX of a level shifter 80 remains low, and a PMOS transistor 69 and an invertor 71 precharge a main word line MWLi at a logic low level (for example, a ground voltage). When the signal PR goes to a logic high level (when a row address designating a sub word line is input), the output signal PDPX of the shifter 80 transitions from low to high, thereby turning off the PMOS transistor 69. As illustrated in FIG. 4, the decode signals DRA0–DRA2 go to a logic high level for a row address selecting the main word line MWLi. When the signal PRREB remains high, an output signal PNWR of an invertor 75 becomes high and turns on the NMOS transistor 79. This makes the invertor 71 activate the main word line MWLi. On the other hand, if the signal PRREB transitions from high to low as illustrated by the dashed line in FIG. 4, the NMOS transistor 79 remains off, and the main word line MWLi remains in a precharged state, for example, at the ground voltage.

Referring to FIG. 3, to prevent a main word line and a redundant main word line from being activated at the same time, an invertor chain 76 provides a delay in the main word line decoder driver 22. In particular, discrimination of whether row address bit signals correspond to a programmed defective row address in the address programming circuit determines whether the signal PRREB activates or deactivates a main word line corresponding to the row address bit signals. As well understood in FIG. 4, the transition of the decode signals DRA0–DRA2 precedes the transition of the signal PRREB. If invertor chain 76 of FIG. 3 were absent, a transition of the decode signals DRA0–DRA2 could activate the main word line MWLi, and then a transition of the signal PRREB during the activation of the main word line, could activate a redundancy main word line. Accordingly, without the delay chain 76, the main word line and the redundant main word line may be activated at the same time when the signal PRREB transitions from a logic high level to a logic low level as illustrated by a dashed line in FIG. 4.

According to the second redundancy scheme, a main word line decoder driver activates or deactivates a main word line MWLi after discriminating whether a row replacement is performed or not (or whether the signal PRREB is activated or not). Therefore, the invertor chain 76, which includes series-connected invertors 72 and 73, delays the activation of the signal PNWR (and activation of the main word line MWLi) by a delay time $t_D$. This increases an access time from a row active (and reduces access speed), which is determined by $t_{RCD}+t_{CAC}$. The $t_{RCD}$ and $t_{CAC}$ indicate $\overline{RAS}$ to $\overline{CAS}$ delay and $\overline{CAS}$ latency, respectively (the $t_{RCD}$ is delayed by the invertor chain 76).

SUMMARY OF THE INVENTION

An embodiment of the present invention provides a semiconductor memory device having a redundant row replacement scheme capable of improving access speed without an increase in layout area.

According to an aspect of the present invention, a semiconductor memory device includes at least one main word line, a plurality of sub word lines coupled to the at least one main word line, at least one redundant main word line, and a plurality of redundant sub word lines coupled to the at least one redundant main word line. The semiconductor memory device further includes a main word line decoder driver, a redundant main word line decoder driver, and an address programming circuit. The main word line decoder driver is coupled to the at least one main word line, and the redundant row decoder driver is coupled to the at least one redundant main word line. The main word line decoder driver drives the at least one main word line in response to a row active signal and decode signals resulting from decoding row address bit signals for main word line selection. The redundant row decoder driver drives the at least one redundant main word line in response to a redundant row select signal. Programming of the address programming circuit indicates defective row address bit signals corresponding to any of the at least one main word line that the at least one redundant main word line replaces. The address programming circuit generates a redundant row select signal when the row address bit signals corresponds to defective row address bit signals. After the activation of the at least one main word line, the at least one main word line is deactivated when the redundant row select signal is activated.

In an exemplary embodiment of the semiconductor memory device, the main row decoder driver includes: a driver; first, second, and third switching elements; a precharge signal generator; and a word line enable signal generator. The driver couples to a node and drives the at least one main word line in response to a potential of the node. The first switching element is between a boosted voltage (higher than a power supply voltage) and the node and is switched on/off in response to a precharge signal. The precharge signal generator generates the precharge signal in response to the row active signal and the redundant row select signal. The second and third switching elements are coupled in series between the node and a ground. The second switching element switches on/off in response to one of the first decode signals, and the third switching element switches on/off in response to a word line enable signal. The word line enable signal generator produces the word line enable signal in response to the redundant row select signal and another of the first decode signals.

When row address bit signals designating a main word line are input, the selected main word line is activated regardless of whether the row address bit signals correspond to programmed defective row address bit signals. When the row address bit signals correspond to the programmed defective row address bit signals, the precharge signal generated through a relatively rapid transfer path of the level shifter rapidly inactivates the main word line.

BRIEF DESCRIPTION OF THE DRAWINGS

The present invention will be described by way of exemplary embodiments, but not limitations, illustrated in the accompanying drawings in which like references denote similar elements, and in which.

DESCRIPTION OF THE PREFERRED EMBODIMENT

Figure 1:
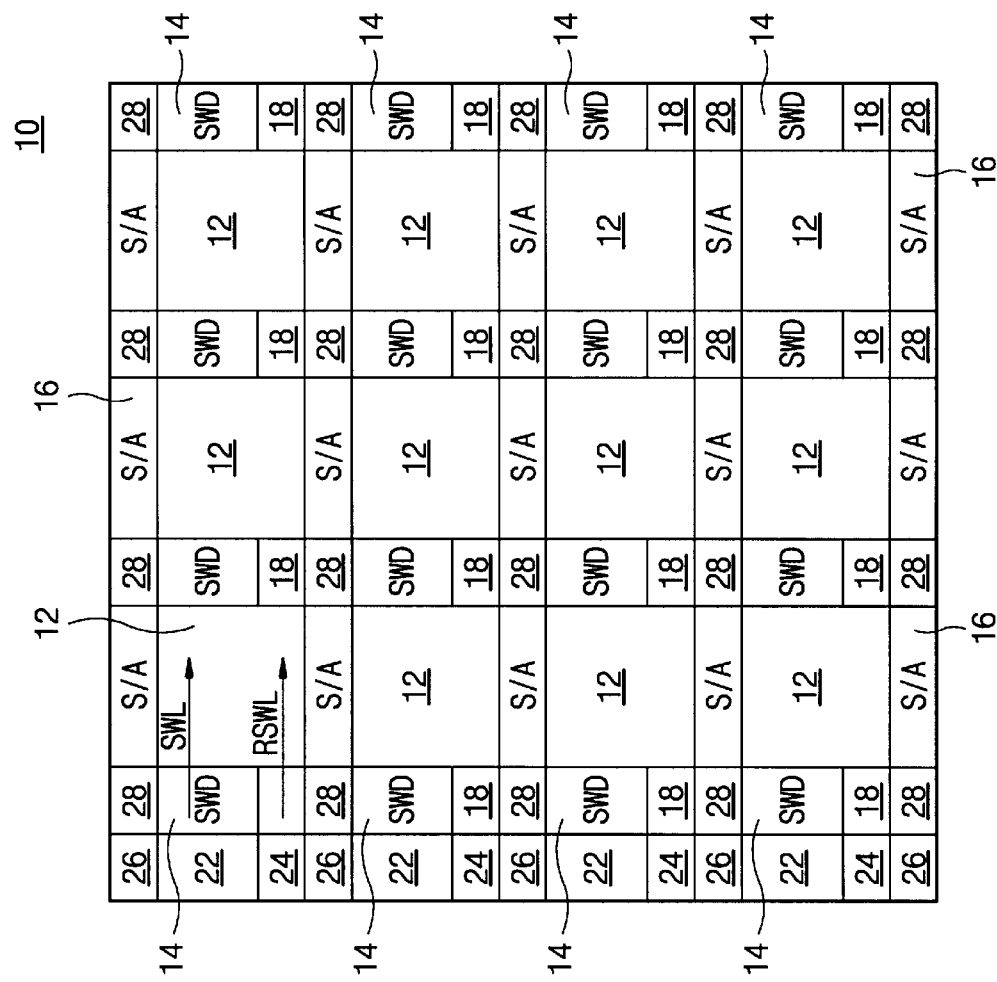
FIG. 1 shows a layout of a conventional semiconductor memory device.
Figure 2:
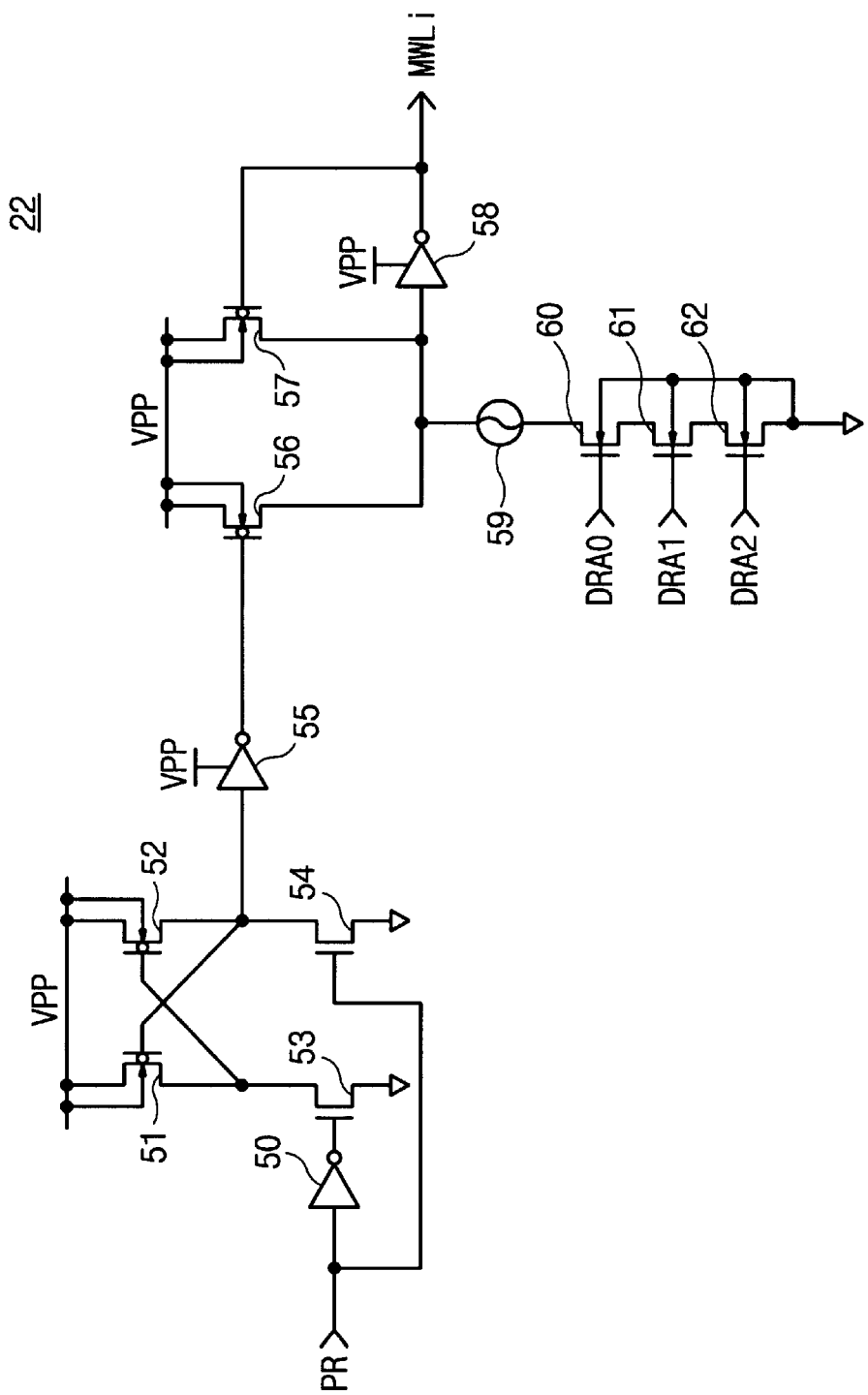
FIG. 2 is a circuit diagram showing a main word line decoder driver used for a first redundancy scheme.
Figure 5:
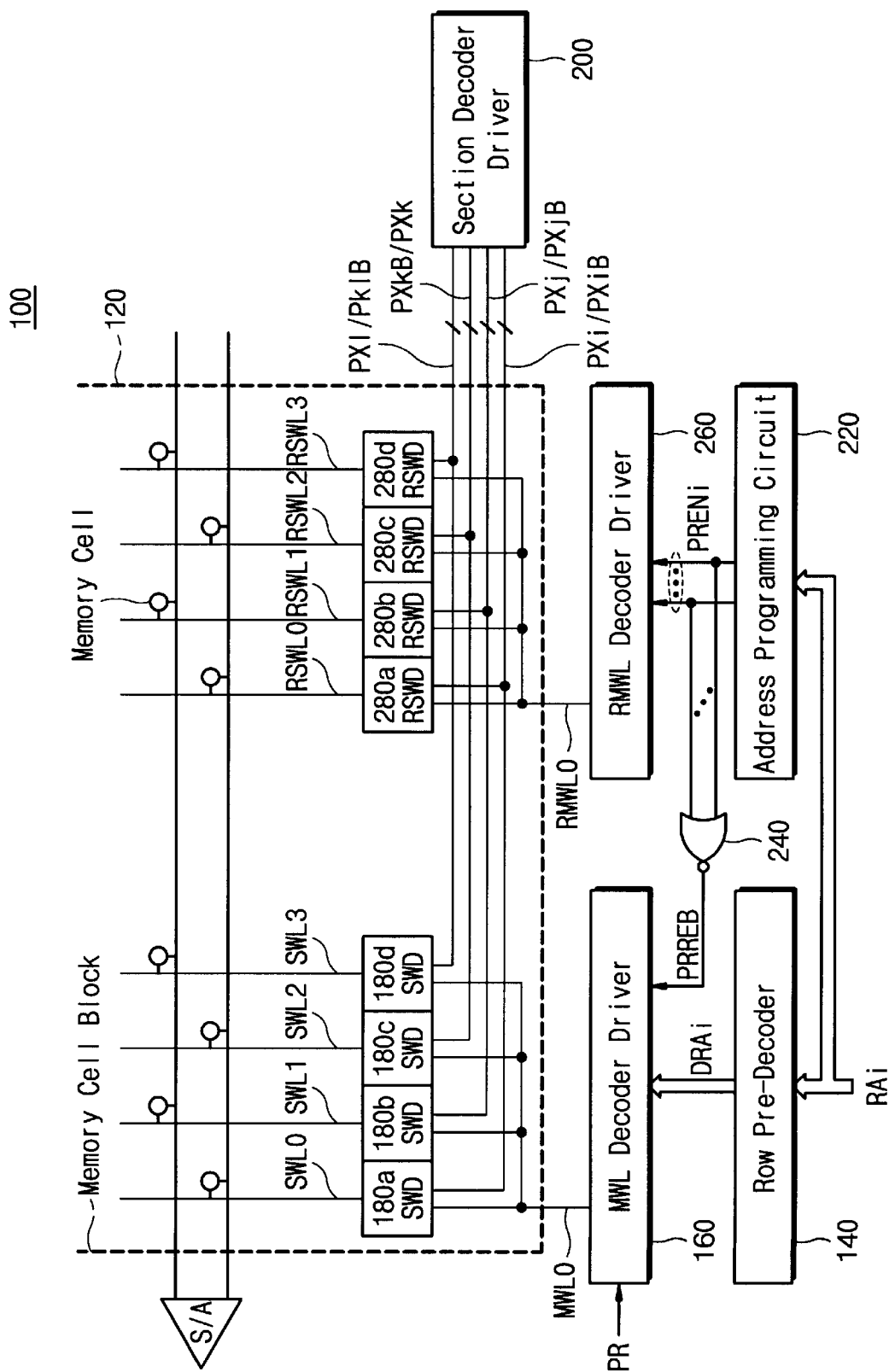
FIG. 5 is a block diagram of a semiconductor memory device according to an embodiment of the present invention.

FIG. 5 is a block diagram of a portion of a semiconductor memory device 100 according to an embodiment of the present invention. In FIG. 5, the semiconductor memory device 100 is a dynamic random access memory (DRAM) device that has a sub word line driver (SWD) structure (sometimes referred to as "a divided word line structure" or "a hierarchical structure"). For the sake of simplicity, only a portion 120 of a memory cell block 12 of FIG. 1 is illustrated in FIG. 5. In particular, the memory cell block 120 of FIG. 5 includes a main word line MWL0, four sub word lines SWL0–SWL3 corresponding to the main word line MWL0, a redundant main word line RMWL0, and four redundant sub word lines RSWL0–RSWL3 corresponding to the redundant main word line RMWL0. Although FIG. 5 only shows one main word line MWL0 and one redundant main row line RMWL0 for simplicity of illustration, an actual memory array would typically contain hundreds or thousands of main word lines and many redundant main row lines. In the art, the term "redundant" may be replaced with the term "spare".

Referring to FIG. 5, the semiconductor memory device 100 further includes a row pre-decoder 140, a main word line decoder driver (or main row decoder driver) 160, four sub word line drivers 180a–180d, a section decoder driver 200, an address programming circuit 220, a NOR gate 240, a redundant main word line decoder driver (a redundant main row decoder driver) 260, and four redundant sub word line drivers 280a–280d.

The main word line decoder driver 160 responds to decode signals (not shown) that result from decoding row address bit signals for word line selection, and drives the main word line MWL0 in response to signals PR, DRAi (in this embodiment, i=0, 1, 2), and PRREB. A section decoder driver 200 selects and drives (or activates) one of the signals therefrom to a boosted voltage VPP, which is higher than a power supply voltage. The section decoder driver 200 includes the sub row decoder 26 and the drivers 28 of FIG. 1 (refer to U.S. Pat. No. 5,761,135). One of the sub word line drivers 180a–180d is designated depending on both the activated main word line MWL0 and the signal selected by the section decoder driver 200.

The address programming circuit 220 (also referred to as "a row fuse programming circuit") (refer to U.S. Pat. No. 5,798,974) contains the fuses that are blown (or cut) to store the addresses of defective rows that redundant rows replace. The address programming circuit 220 compares row address bit signals designating the main word line MWL0 with the programmed defective row address bit signals. The address programming circuit 220 activates one of signals PRENi to select one of the redundant main word lines if a comparison indicates the row address bit signals correspond to a defective row. The redundant main word line decoder driver 260 drives the redundant main word line RMWL0 or another redundant main word line (not shown) that corresponds to the activated one of signals PRENi. One of the redundant sub word line drivers 280a–280d is designated depending on both the activated redundant main word line RMWL0 and the signal selected by the section decoder driver 200.

In FIG. 5, the NOR gate 240 generates a redundant enable signal PRREB for controlling the main row decoder driver 160. The redundant enable signal PRREB is at a logic low level when any of the signals PRENi is at a logic high level. The signal PRREB being low means that one of the redundant main word lines RMWL0 replaces the main word line MWL0 corresponding to the row address bit signals RAi. The NOR gate 240 generates the redundant enable signal PRREB at a logic high level when the signals PRENi remain low. The signal PRREB being high means that the main word line MWL0 is selected and driven normally through the main word line decoder driver 160. If only one redundancy main word line is implemented, a signal PREN for selecting the redundant main word line may be used directly (or after inverting) as the redundant enable signal PRREB.

Figure 6:
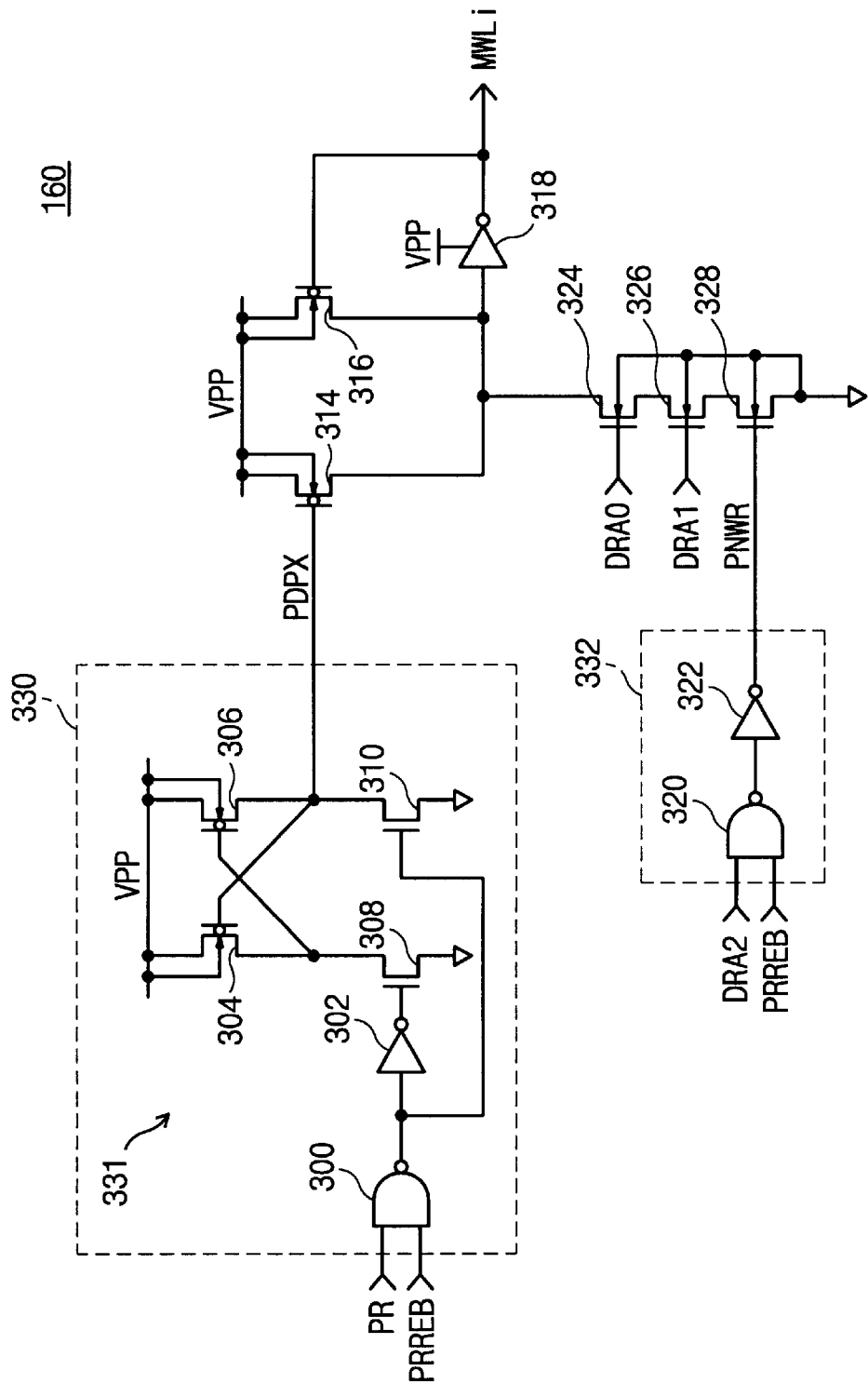
FIG. 6 hows an exemplary embodiment of a main word line decoder driver according to the present invention.

FIG. 6 illustrates an exemplary embodiment of a main word line decoder driver 160 according to the present invention. The main word line decoder driver 160 of FIG. 6 includes a precharge signal generator 330, a word line enable signal generator 332, an invertor 318, two PMOS transistors 314 and 316, and three NMOS transistors 324, 326, and 328 connected as illustrated in FIG. 6. The precharge signal generator 330 includes a NAND gate 300 and a level shifter 331. The word line enable signal generator 332 is AND logic including a NAND gate 320 and an invertor 322. The PMOS transistor 316 and the invertor 318 constitute a latch circuit, and the invertor 318 functions as a driver for the main word line MWLi.

Figure 3:
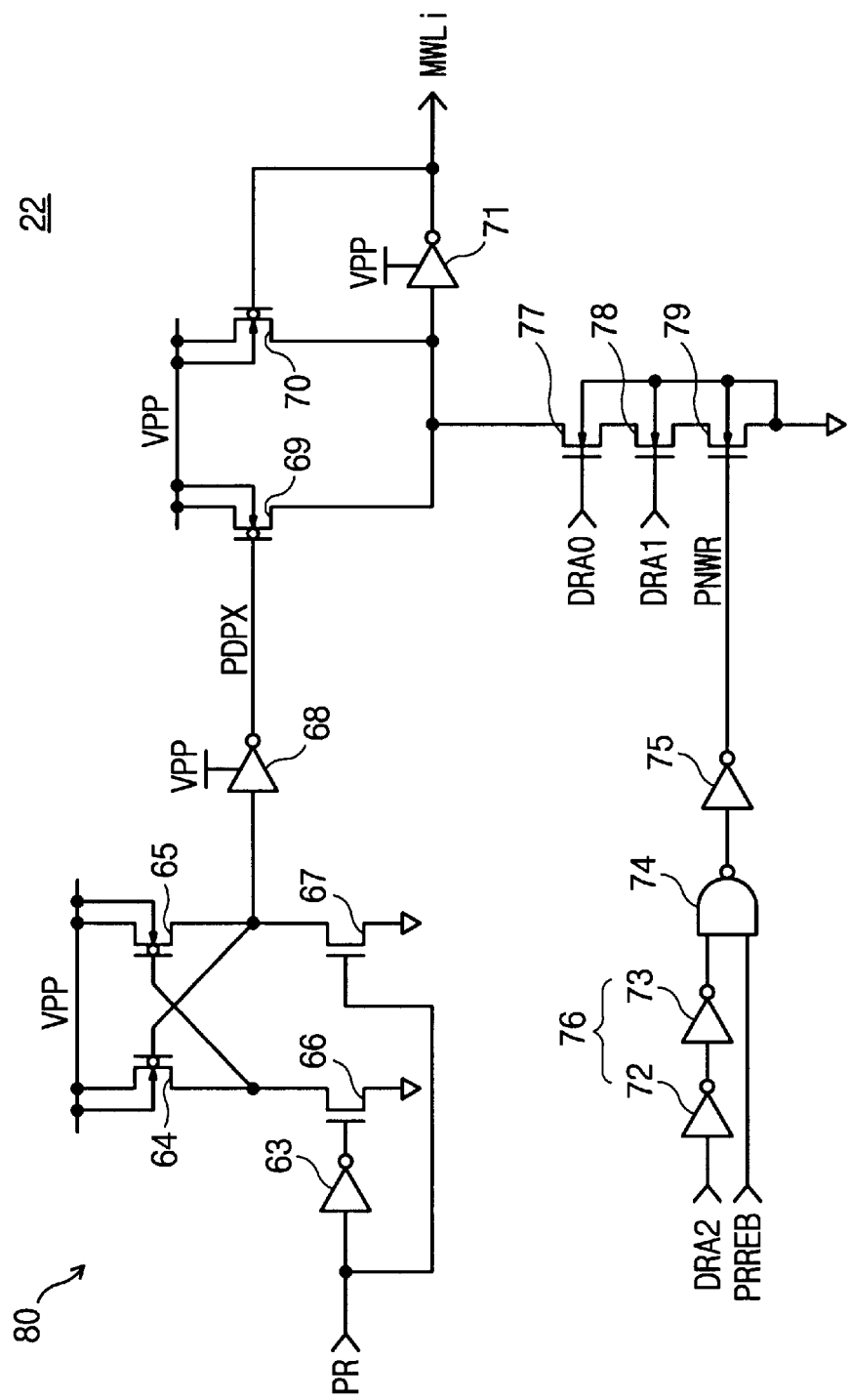
FIG. 3 is a circuit diagram showing a main word line decoder driver used for a second redundancy scheme.
Figure 4:
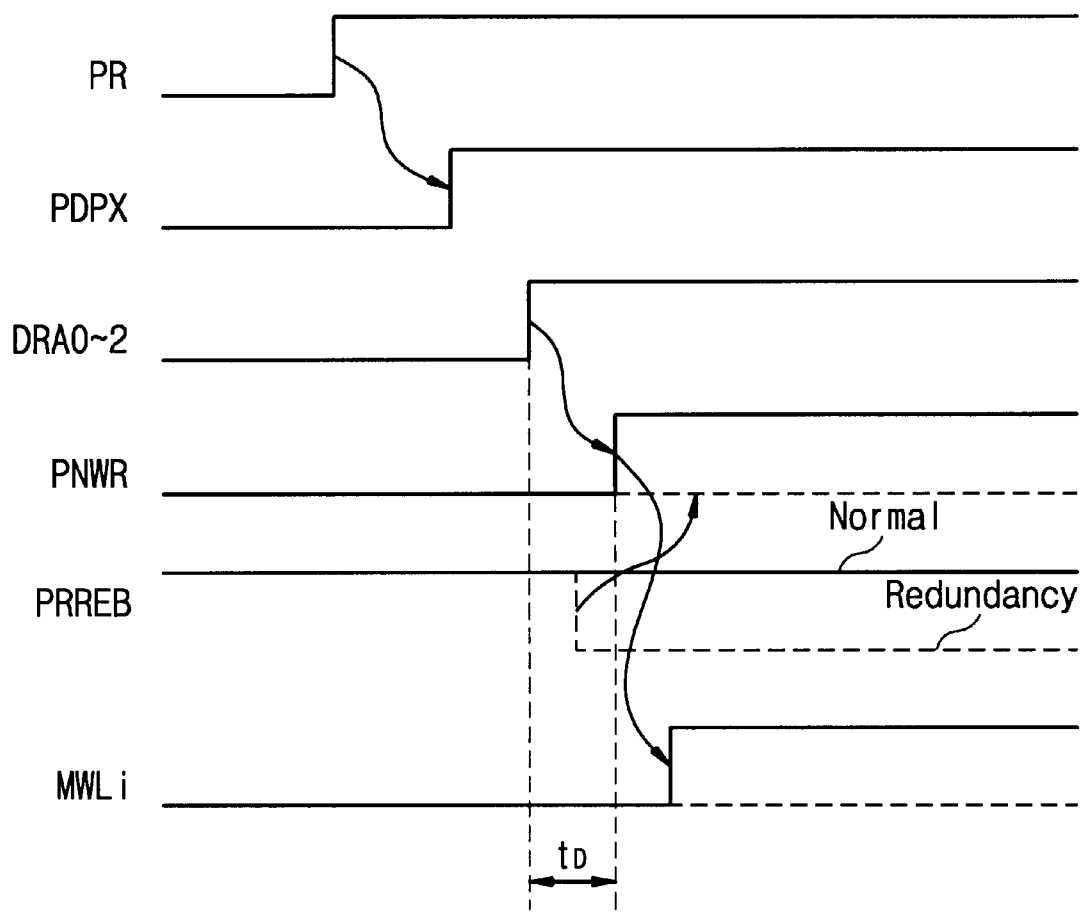
FIG. 4 is a timing diagram showing relationships among control signals in the main word line decoder driver of FIG. 3.

When compared with the main word line decoder driver of FIG. 3, the main word line driver 160 of FIG. 6 does not include the invertor chain 76 that the system of FIG. 3 requires to prevent the concurrent (coincident) activation of the word lines MWL0 and RMWL0. Additionally, the level shifter 331 of the precharge signal generator 330 provides a high-to-low transition of the precharge signal PDPX that is more rapid than a low-to-high transition of the precharge signal PDPX.

Figure 7A:
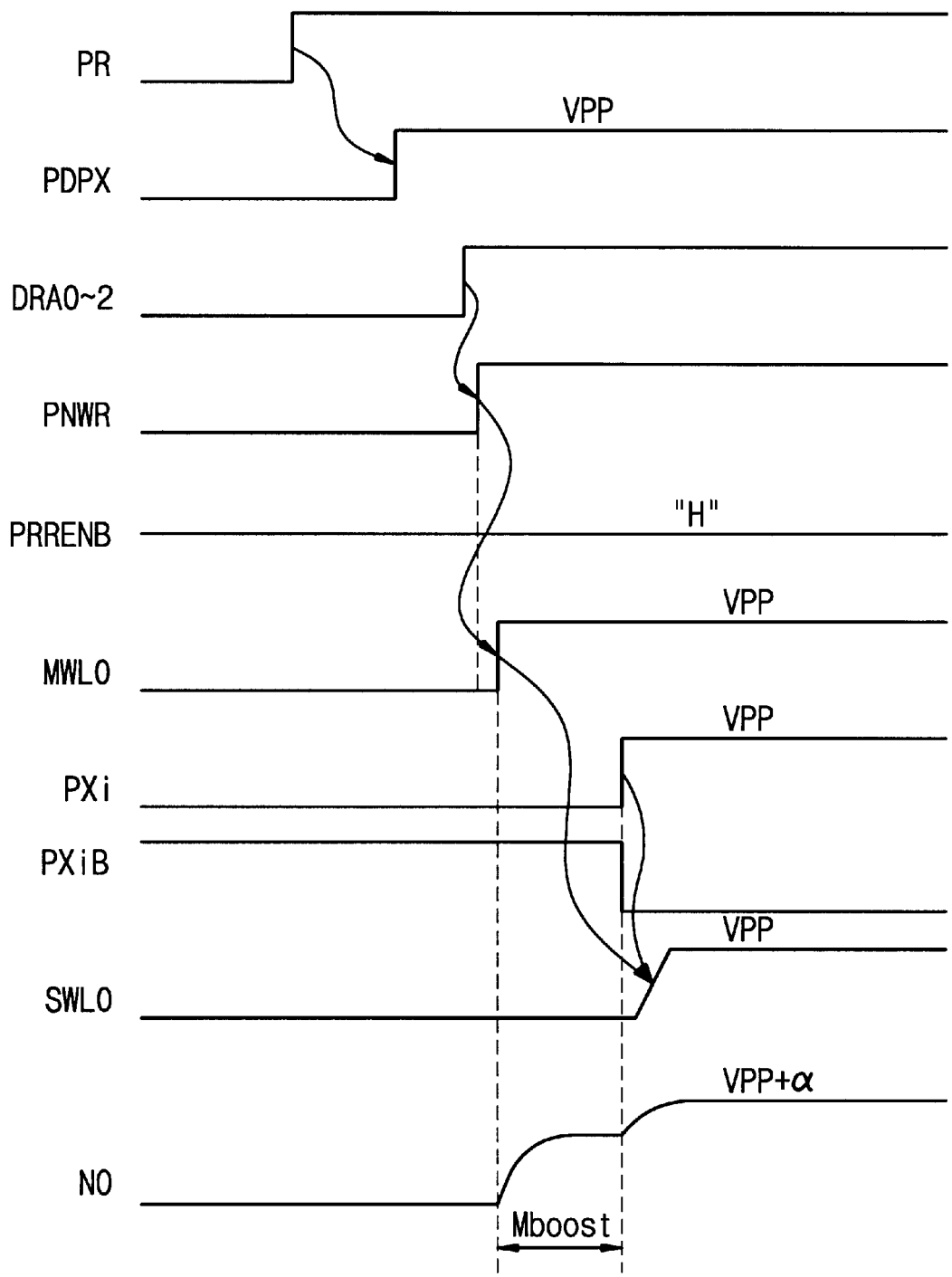
FIG. 7A is a timing diagram illustrating operation of a main word line decoder driver according to the present invention without row replacement.

FIG. 7A is a timing diagram illustrating operation of the main word line decoder driver 160 of FIG. 6 when no row replacement is performed. When the signal PR goes to a logic high level (i.e., when row address bit signals corresponding to the main word line MWL0 are received), the precharge signal PDPX transitions from a logic low level to a logic high level. The low-to-high transition is through a relatively slow transfer path including the invertor 302, the NMOS transistor 308, and the PMOS transistor 306 in the precharge signal generator 330. The transition of the precharge signal to the logic high level turns off the PMOS transistor 314. When the row address bit signals correspond to the main word line MWLi, the row predecoder 140 activates the decode signals DRA0–DRA2, and the NMOS transistors 324 and 326 of the main word line decoder driver 160 turn on. Since the redundant enable signal PRREB from the NOR gate 240 remains high, the word line enable signal PNWR from the generator 332 goes to a logic high level according to the level of the decode signal DRA2. As a result, the NMOS transistors 324, 326, and 328 and the invertor 318 activate the main word line MWL0. Accordingly, the main word line MWL0 is activated without the delay time $t_D$ of the invertor chain 76.

Figure 8:
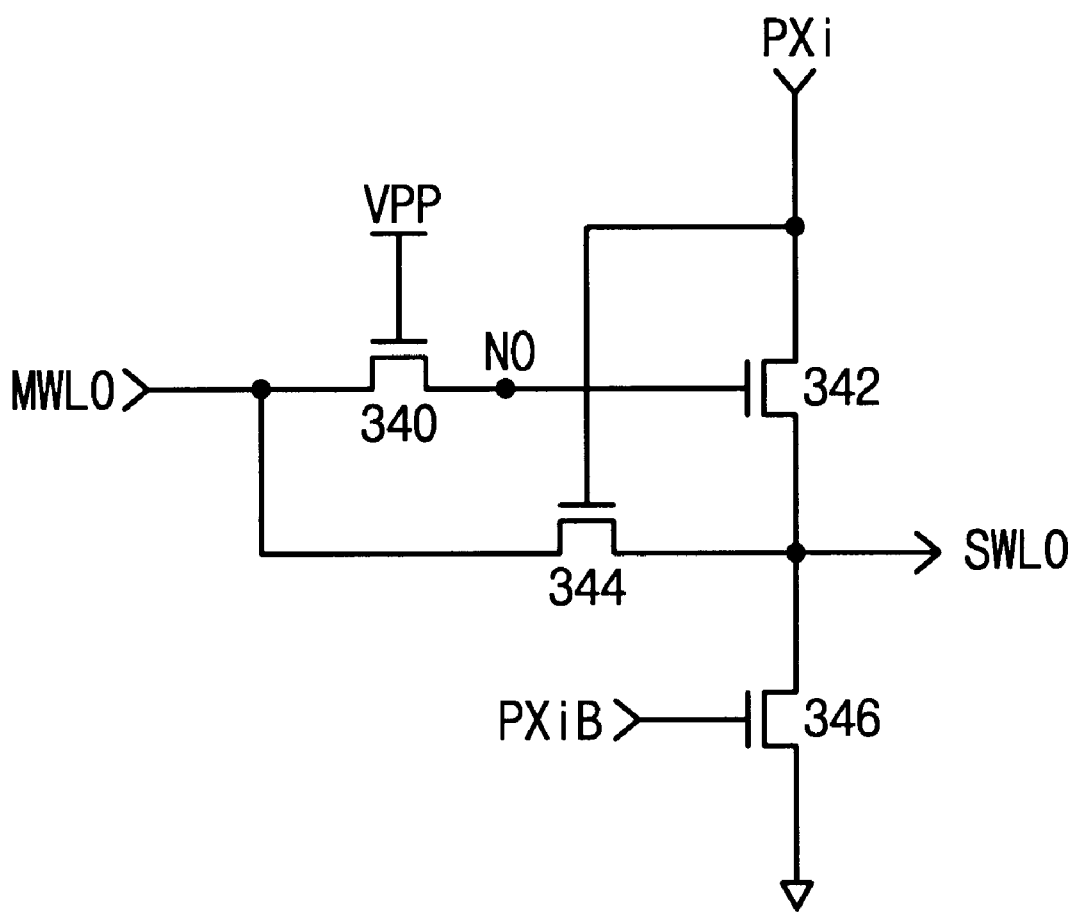
FIG. 8 is an exemplary embodiment of a sub word line driver according to the present invention.

FIG. 8 shows an exemplary embodiment of a sub word line driver according to the present invention. Activation of the main word line MWL0 charges a node N0 in the sub word line driver of FIG. 8 to a high level through an NMOS transistor 340 having a gate coupled to the boosted voltage VPP. When a potential of the node NO approaches the high level (for example, after a boosting margin $M_{boost}$ of FIG. 7A), the signal PXi from the section decoder driver 200, for the designated sub word line, goes to a logic high level having the boosted voltage VPP. A voltage of the node NO, for example, VPP-Vtn, is boosted so as to fully transfer the boosted voltage VPP to the selected sub word line SWL0, and at the same time, the sub word line SWL0 is charged through the NMOS transistor 342.

Figure 7B:
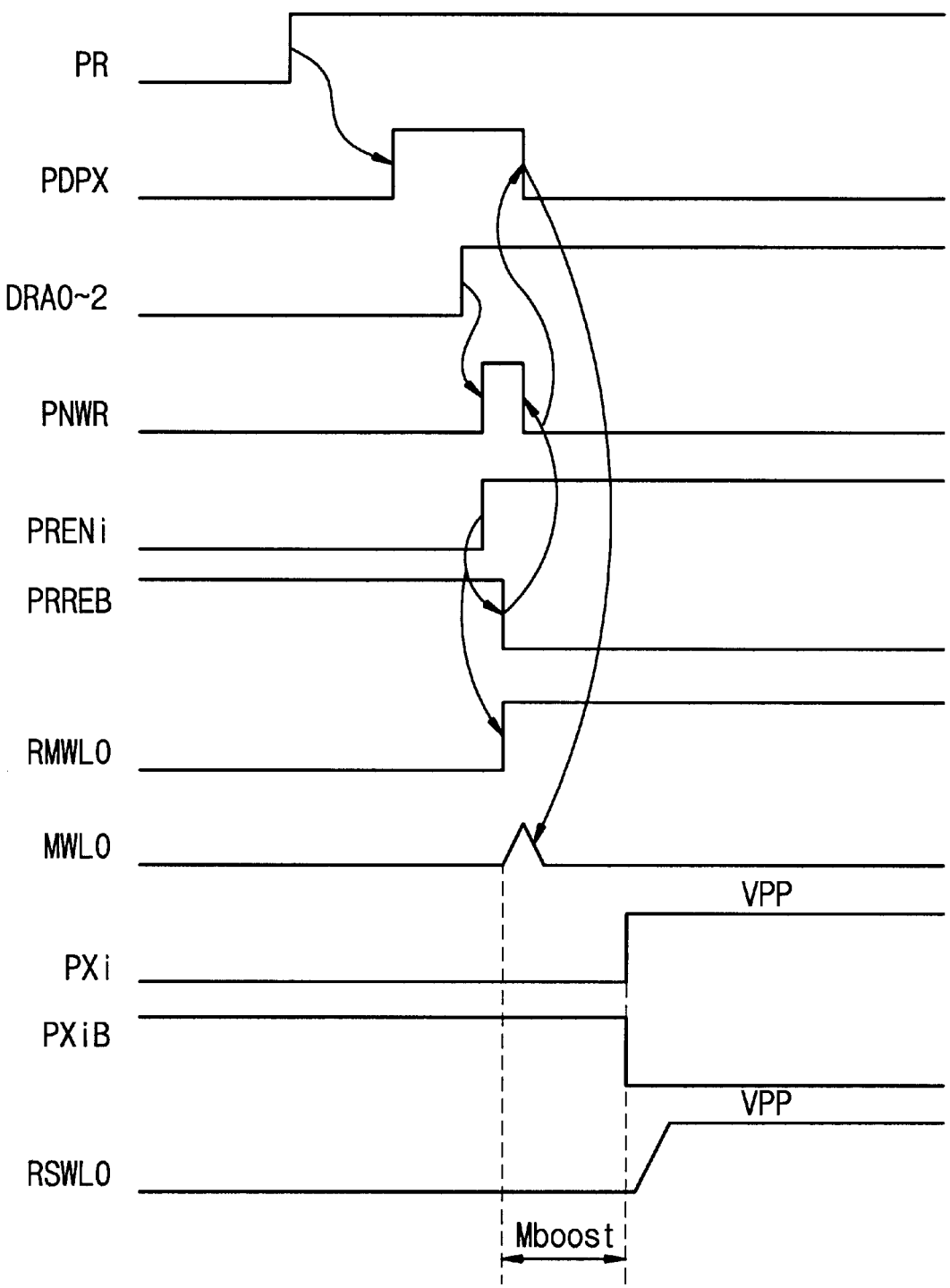
FIG. 7B is a timing diagram illustrating operation of a main word line decoder driver according to the present invention with row replacement.

FIG. 7B is a timing diagram illustrating operation of the main word line decoder driver 160 of FIG. 6 when a redundant row replaces the row corresponding to the main word line decoder driver 160. When the signal PR goes to a logic high level (e.g., when row address bit signals corresponding to the main word line MWL0 are received), the precharge signal PDPX transitions from the logic low level to the logic high level through the relatively slow transfer path including the invertor 302, the NMOS transistor 308, and the PMOS transistor 306. The low-to-high transition turns off the PMOS transistor 314. The row predecoder circuit 140 activates the decode signals DRA0–DRA2, which turn on the NMOS transistors 324 and 326. Since the redundant enable signal PRREB from the NOR gate 240 is initially high, the word line enable signal PNWR from the generator 332 goes to a logic high level in response to the decode signal DRA2. As a result, the NMOS transistors 324, 326, and 328 and the invertor 318 start to charge the main word line MWL0 regardless of whether the row address bit signals correspond to a defective row. As illustrated in FIG. 7B, the main word line MWL0 is partially activated as a glitch having a level raising no problem.

When the row address bit signals correspond to a programmed defective row address, the signal (redundant row select signal) PRENi corresponding to the redundant main word line RMWL0 goes to a logic high level, and the redundant enable signal PRREB from the NOR gate 240 becomes low. In response, the precharge signal generator 330 deactivates the precharge signal PDPX through a relatively rapid transfer path. This transfer path includes the NMOS transistor 310, which directly pulls down the precharge signal PDPX. As a result, PMOS transistor 314 is turned on. The generator 332 drives the word line enable signal PNWR to a logic low level in response to the transition of the redundant enable signal PRREB and thereby turns off the NMOS transistor 328. Accordingly, the activated main word line MWL0 is deactivated (or returned to the precharged state), and the redundancy main word line RMWL0 can be activated. After this, a redundant sub word line RSWL0 is charged in the manner of the charging of the sub word line SWL0 described above in regard to FIG. 7A, and description thereof is thus omitted.

According to an aspect of the present invention, when row address bit signals are input, a main word line begins to activate regardless of whether the row address bit signals correspond to a defective row. When the row address bit signals correspond to the programmed defective row address, the main word line is rapidly deactivated by the precharge signal PDPX generated through a relatively rapid transfer path of the level shifter 331. When a main word line is normally selected or when a main word line is replaced with a redundant main word line, there is no access delay such as caused by the invertor chain 76 of FIG. 3. As a result, an access time from a row active, which is determined by $t_{RCD}+t_{CAC}$, is reduced and access speed is improved, without an increase of a layout area.

The invention has been described using exemplary embodiments. However, the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor memory device having at least one main word line, a plurality of sub word lines coupled to the at least one main word line, at least one redundant main word line, and a plurality of redundant sub word lines coupled to the at least one redundant main word line, the device comprising:

a main row decoder driver coupled to the at least one main word line, the main row decoder driver driving the at least one main word line in response a row active signal and to decode signals decoding row address bit signals for main word line selection;

an address programming circuit storing defective row address bit signals corresponding to any of the at least one main word line replaced by the at least one redundant main word line, the address programming circuit generating a redundant row select signal when the row address bit signals corresponds to the defective row address bit signals; and a redundant row decoder driver coupled to the at least one redundant main word line, the redundant row decoder driver driving the at least one redundant main word line in response to the redundant row select signal, wherein after the activation of the at least one main word line, the at least one main word line is deactivated when the redundant row select signal is activated.

2. The semiconductor memory device according to claim 1, further comprising:

a section decoder driver that generates a select signal in response to second decode signals resulting from decoding second row address bit signals for sub word line selection;

a plurality of sub word line drivers connected to the sub word lines, each of sub word line drivers coupling the at least one main word line to one of the sub word lines in response to the select signal; and a plurality of redundant sub word line drivers connected to the redundant sub word lines, each of the redundant sub word line drivers coupling the at least one redundant main word line to one of the redundant sub word lines in response to the select signal.

3. The semiconductor memory device according to claim 2, wherein the main row decoder driver comprises:

a driver coupled to a node, for driving the at least one main word line in response to a potential of the node;

a first switching element coupled between a boosted voltage that is higher than a power supply voltage and the node, the first switching element being switched on/off in response to a precharge signal;

a precharge signal generator that produces the precharge signal in response to the row active signal and the redundant row select signal;

second and third switching elements coupled in series between the node and a ground, wherein the second switching element is switched on/off in response to one of the first decode signals and the third switching element is switched on/off in response to a word line enable signal; and a word line enable signal generator that produces the word line enable signal in response to the redundant row select signal and another of the first decode signals, wherein at the activation of the redundant row select signal, the precharge and word line enable signals are deactivated so as to precharge the at least one main word line thus activated.

4. The semiconductor memory device according to claim 3, wherein the precharge signal generator comprises:

a NAND gate having input terminals respectively receiving the row active signal and the redundant row select signal; and a level shifter coupled to an output terminal of the NAND gate, the level shifter generating the precharge signal in response to an output signal of the NAND gate, wherein a high-to-low transition of the precharge signal is more rapid than a low-to-high transition thereof.

5. The semiconductor memory device according to claim 3, wherein the word line enable signal generator comprises:

a NAND gate having input terminals respectively receiving the redundant row select signal and the other of the first decode signals; and an invertor having an input terminal coupled to an output terminal of the NAND gate and an output terminal outputting the word line enable signal.

6. A semiconductor memory device comprising:

a plurality of memory cell blocks each having a plurality of memory cells arranged in an array;

a plurality of main word lines extending through the memory cell blocks;

a plurality of redundant main word lines extending through the memory cell blocks;

a main row decoder driver coupled to the main word lines, the main row decoder driver selecting and driving one main word line in response to a row active signal and decode signals decoding row address bit signals for main word line selection;

a redundant row decoder driver coupled to the redundant main word lines, the redundant row decoder selecting and driving one redundant main word line in response to redundant row select signals;

an address programming circuit storing defective row address bit signals corresponding to one of the main word line replaced by one of the redundant main word line, the address programming circuit activating one of the redundant row select signals when the row address bit signals corresponds to the defective row address bit signals; and a control circuit that generates a redundant enable signal in response to the redundant row select signals, wherein after the activation of a selected main word line, the main row decoder driver inactivates the selected main word line when the redundant enable signal is activated.

7. The semiconductor memory device according to claim 6, wherein the control circuit is comprised of a NOR gate having input terminals receiving the redundant row select signals and an output terminal outputting the redundant enable signal.

8. The semiconductor memory device according to claim 6, wherein the main row decoder driver comprises:

a driver coupled to a node that drives a corresponding one of the main word lines in response to a potential of the node;

a PMOS transistor coupled between a boosted voltage and the node, the PMOS transistor being turned on/off in response to a precharge signal;

a precharge signal generator that produces the precharge signal in response to the row active signal and the redundant enable signal;

a first NMOS transistor having a drain coupled to the node and a gate receiving a first of the decode signals;

a second NMOS transistor having a drain coupled to a source of the first NMOS transistor and a gate receiving a second of the decode signals;

a third NMOS transistor having a drain coupled to a source of the second NMOS transistor, a gate receiving a word line enable signal, and a source grounded; and a word line enable signal generator that produces the word line enable signal in response to the redundant enable signal and a third of the decode signals, wherein at the activation of the redundant enable signal, the precharge and word line enable signals are deactivated so as to precharge the selected main word line.

9. The semiconductor memory device according to claim 8, wherein the precharge signal generator comprises:

a NAND gate having input terminals respectively receiving the row active signal and the redundant enable signal; and a level shifter coupled to an output terminal of the NAND gate, the level shifter generating the precharge signal in response to an output signal of the NAND gate, wherein a high-to-low transition of the precharge signal is more rapid than a low-to-high transition thereof.

10. The semiconductor memory device according to claim 8, wherein the word line enable signal generator comprises:

a NAND gate having input terminals respectively receiving the redundant enable signal and the third decode signal; and an invertor having an input terminal coupled to an output terminal of the NAND gate and an output terminal outputting the word line enable signal.

11. In a semiconductor memory device comprising at least one main word line, at least one redundant main word line, and a plurality of memory blocks each of which has a plurality of memory cells arranged in row and column directions, a plurality of sub word lines corresponding to the at least one main word line, and a plurality of redundant sub word lines corresponding to the at least one redundant word line, a method for driving a word line comprising the steps of:

activating a selected one of the at least one main word line when row address bit signals designating the selected main word line are provided into the device;

generating a redundant enable signal when the row address bit signals correspond to programmed defective row address bit signals; and deactivating the selected main word line in response to the redundant enable signal.

* * * * *